United States Patent
Sheng et al.

(10) Patent No.: US 8,964,374 B1
(45) Date of Patent: Feb. 24, 2015

(54) VERTICAL TRAY STRUCTURE FOR RACK IN DATA CENTER

(75) Inventors: Honggang Sheng, Milpitas, CA (US); Sangsun Kim, San Jose, CA (US)

(73) Assignee: Google Inc., Mountain View, CA (US)

( * ) Notice: Subject to any disclaimer, the term of this patent is extended or adjusted under 35 U.S.C. 154(b) by 279 days.

(21) Appl. No.: 13/406,982

(22) Filed: Feb. 28, 2012

(51) Int. Cl.
*H05K 7/20* (2006.01)

(52) U.S. Cl.
USPC ...... 361/679.49; 361/694; 361/696; 361/701; 62/259.2; 312/223.2; 454/184

(58) Field of Classification Search
USPC .................. 361/676–678, 679.46–679.54, 361/688–722, 752, 831
See application file for complete search history.

(56) References Cited

U.S. PATENT DOCUMENTS

| | | | |
|---|---|---|---|
| 5,718,628 A * | 2/1998 | Nakazato et al. | 454/184 |
| 6,034,873 A * | 3/2000 | Stahl et al. | 361/701 |
| 6,920,049 B2 | 7/2005 | Brooks et al. | |
| 7,312,990 B2 | 12/2007 | Mangold | |
| 7,420,805 B2 | 9/2008 | Smith et al. | |
| 7,430,118 B1 * | 9/2008 | Noteboom et al. | 361/695 |
| 7,568,360 B1 * | 8/2009 | Bash et al. | 62/186 |
| 7,856,166 B2 | 12/2010 | Biribuze et al. | |
| 7,961,463 B2 * | 6/2011 | Belady et al. | 361/695 |
| 8,405,977 B2 * | 3/2013 | Lin | 361/679.51 |
| 2001/0052412 A1 * | 12/2001 | Tikka | 165/299 |
| 2004/0264145 A1 | 12/2004 | Miller et al. | |
| 2008/0064317 A1 | 3/2008 | Yates et al. | |
| 2008/0204999 A1 | 8/2008 | Clidaras et al. | |
| 2008/0264880 A1 | 10/2008 | Wagner et al. | |
| 2009/0308579 A1 * | 12/2009 | Johnson et al. | 165/104.34 |
| 2010/0165565 A1 | 7/2010 | Hellriegal et al. | |
| 2012/0044631 A1 * | 2/2012 | Wei | 361/679.47 |

OTHER PUBLICATIONS

Cirrascale "BladeRack 2 XL Platform, The Industry's Densest, Most Scalable Blade-Based Cloud Storage and Compute Solution," www.cirrascale.com, Product Data Sheet BladeRack 2 XL, San Diego, CA, 2 pages, accessed on Jul. 25, 2011.

Cirrascale's "Patented Technology is the Difference, Award-winning Vertical Cooling Technology enables extreme density and efficiency," 3 pages, accessed on Jul. 25, 2011.

Rich Miller "Data Center Knowledge, Report: Google Uses About 900,000 Servers" 14 pages, accessed on Aug. 3, 2011.

* cited by examiner

*Primary Examiner* — Courtney Smith
(74) *Attorney, Agent, or Firm* — Fish & Richardson P.C.

(57) ABSTRACT

Systems and methods are provided for cooling electronic equipment in a data center. Ambient air is vertically circulated from a workspace across a plurality of rack-mounted electronic devices. The electronic devices are located in a plurality of trays such that each tray has a major plane that is substantially parallel to a side plane of the rack. The circulated air is cooled with a heat exchanger that is connected to a vertical end of the rack via a sealed interface. Multiple racks can be arrayed in a distributed cooling arrangement, which increases reliability and scalability of the data center.

20 Claims, 5 Drawing Sheets

VERTICAL TRAY STRUCTURE FOR RACK IN DATA CENTER

FIELD OF THE DISCLOSURE

The present disclosure relates generally to managing facility power and cooling and in particular to systems and methods for providing cooling for areas containing computer equipment, such as racks in computer data centers.

BACKGROUND

Only a fraction of the electricity consumed by a data center actually powers information technology (IT) equipment such as servers, storage devices, and networking devices. The rest is either dissipated during power delivery within the data center or consumed by environmental control systems such as Computer Room Air Conditioning (CRAC), chillers, condensers, fans, and so on. The data center Power Usage Effectiveness (PUE), defined as the ratio of the total facility power consumption to the power used by the IT equipment, is a common measure of the data center's efficiency. Many data center have a PUE of approximately 2, indicating that for every watt of power consumed by the data center's IT equipment, one additional watt is consumed to cool and distribute power to the IT equipment.

Data center operators have to balance two competing goals minimizing the energy used by environmental control systems while at the same time ensuring that computer equipment operation is not negatively affected by high temperatures. Heat removal may be important to ensure proper functioning of the data center because high temperatures may significantly increase microprocessor errors and equipment failure. The cost of removing heat can be a major expense of operating data centers.

SUMMARY

Systems and methods are provided for cooling electronic equipment. In one aspect, a method of cooling electronic equipment on a rack includes vertically circulating ambient air from a workspace across a plurality of rack-mounted electronic devices. The electronic devices are located in a plurality of trays where each tray has a major plane and is arranged so that its major plane is substantially parallel to a side plane of the rack. The method further includes cooling the circulated air with a heat exchanger that is connected to a vertical end of the rack via a sealed interface, and re-circulating the cooled air to the workspace.

In another aspect, a cooling system for cooling electronic equipment on a rack includes one or more air circulation fans for vertically circulating ambient air from a workspace across a plurality of rack-mounted electronic devices. The electronic devices are located in a plurality of trays such that each tray has a major plane and is arranged so that its major plane is substantially parallel to a side plane of the rack. The cooling system also includes a heat exchanger, local to the rack, for cooling the circulated air and re-circulating the cooled air to the workspace. The heat exchanger is connected to a vertical end of the rack via a sealed interface.

In yet another aspect, a system of cooling electronic equipment on a rack includes means for vertically circulating ambient air from a workspace across a plurality of rack-mounted electronic devices. The electronic devices are located in a plurality of trays and each tray has a major plane and is arranged so that its major plane is substantially parallel to a side plane of the rack. The cooling system further includes means for cooling the circulated air, where the means for cooling is connected to a vertical end of the rack via a sealed interface, and means for re-circulating the cooled air to the workspace. The re-circulated cooled air has a temperature that is substantially equal to a temperature of the ambient air in the workspace.

BRIEF DESCRIPTION OF THE FIGURES

The methods and systems may be better understood from the following illustrative description with reference to the following drawings in which.

DETAILED DESCRIPTION

To provide an overall understanding, certain illustrative implementations will now be described, including systems and methods for providing cooling for areas containing computer equipment, such as racks in data centers. However, it will be understood by one of ordinary skill in the art that the systems and methods described herein may be adapted and modified as is appropriate and that the systems and methods described herein may be employed in other suitable implementations, and that such other additions and modifications will not depart from the scope thereof.

Figure 1:
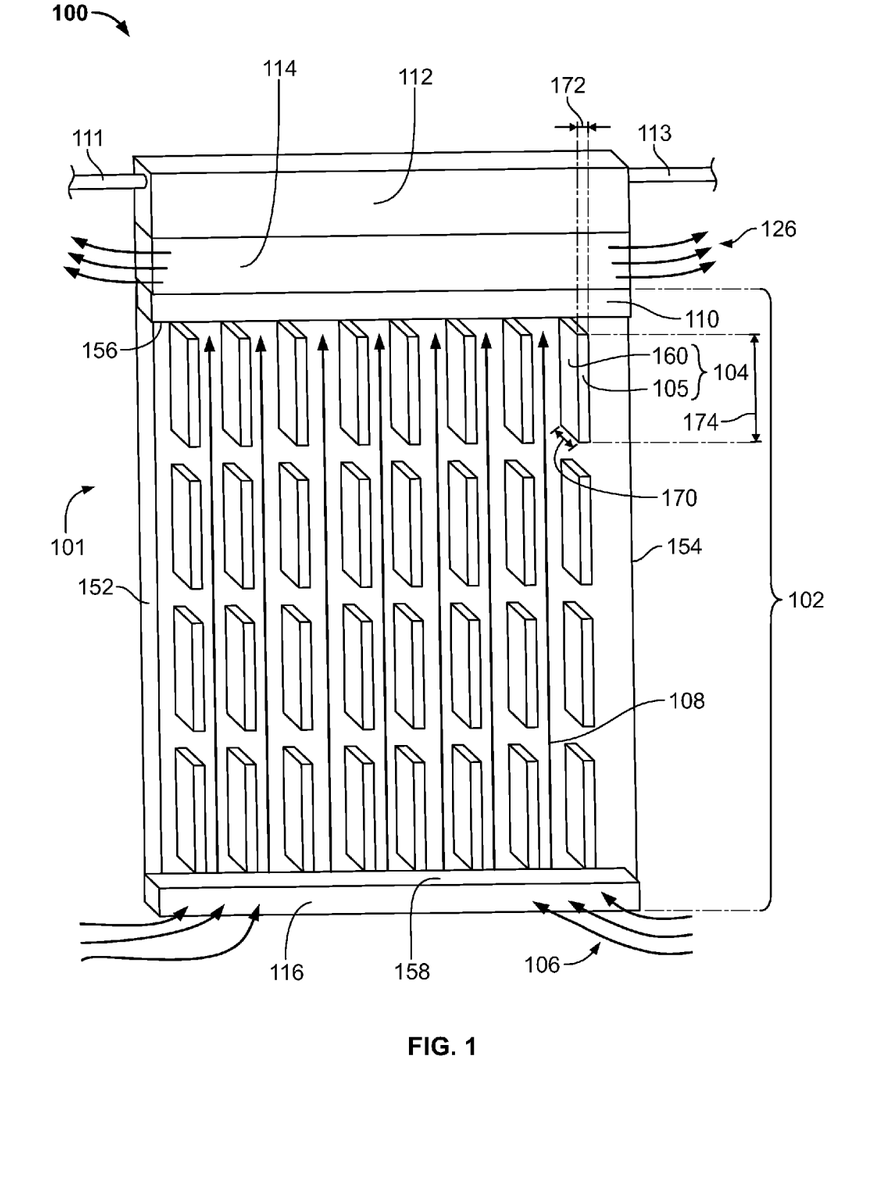
FIG. 1 shows a front view of an exemplary data center rack system according to some implementations.

FIG. 1 shows a front view of an exemplary data center rack system 100 according to some implementations. Data center rack system 100 includes rack 102 that carries a number of trays 104. Data center rack system 100 also includes a bottom fan module 106, a top fan module 110, heat exchange space 114, and heat exchanger 112. The rack 102 has two side planes, left side plane 152 and right side plane 154, as well as two vertical end planes, top plane 156 and bottom plane 158. Optionally, the rack includes a back plane (not shown).

As can be seen from FIG. 1, each rack 102 may hold a number of trays 104, on which various electronic devices are located. Although FIG. 1 shows that trays 104 are separately attached to the rack, other arrangements may be used. For example, trays may be stacked one over the other. A tray may be mounted vertically in the rack, for example, by sliding the tray into the rack from the front of the rack and over rails in the rack on opposite sides of the tray. These rails may be mounted vertically as columns or horizontally as rows on the rack. Alternatively, trays may be pinned, e.g., bolted, welded, and/or fastened to the rack. For example, trays may be pinned to rails of the rack or to a side or back of the rack.

Each tray 104 is mounted in a vertical arrangement, such that the tray has a major plane that is arranged substantially parallel to a side plane of the rack. A major plane refers to the dominant geometrical plane of an object and is mathematically defined as the plane that minimizes the integral of the squared perpendicular distance of all object points to the plane. For example, tray 104 in FIG. 1 has major plane 160. Tray 104 is arrayed with other trays 104 such that major plane 160 is substantially parallel to side planes 152 and/or 154.

The term tray is not limited to any particular structure, but instead includes any arrangement 105 of computer-related components coupled together to serve one or more purpose, such as a motherboard or a storage device. Trays may be implemented in particular configurations, including as computer servers, switches (e.g., electrical and/or optical), routers, storage drives or groups of drives or other storage structures, and other computing related devices. Each such tray arrangement or device 105 has a width dimension 172, a depth dimension 170, and a height dimension 174. The arrangements are disposed such that the height dimension 174 is longer than the width dimension 172, and such that the arrangement 105 is mounted to a tray having a major plane 160 substantially parallel to the height dimension 174.

The spacing of the individual trays may be made as close as is practical, subject to the size of the equipment mounted on each tray and the need for air circulation around each tray. Although the spacing between trays 104 in the example of FIG. 1 is shown to be uniform, the spacing between trays 104 may vary, for example, with certain types of trays (e.g., for storage equipment) being placed in a certain spacing and others (e.g., for server processors) being placed in a different spacing.

Equipment components of trays 104 generate heat as they function. Fan modules 106 and 110 provide for the flow of cooling air 108 across trays 104. Air enters rack 102 from a workspace through fan module 106 at the bottom of rack 102. A workspace refers to areas surrounding data center rack system 100, for example, areas in which technicians or others may move to monitor and/or attend to equipment in a data center. Fan module 106 includes any number of air circulation fans located in a plenum that is local to the rack and is located at the bottom of the rack. As described herein, a plenum local to a rack refers to a plenum that is adjacent to, connected to, coupled to, and/or corresponding to the rack. In one implementation, the plenum is directly coupled to one and only one rack from a plurality of racks in a data center. In another implementation, the plenum may be directly coupled to a subset of the plurality of racks in the data center. Fan module 106 captures from the workspace air that has an ambient temperature. Ambient temperature refers to a target temperature of the workspace under circumstances acceptable for operation. For example, the ambient temperature may be determined based on a range of allowable temperatures, such as federal or state OSHA-mandated temperatures. The ambient temperature may slightly change in different data centers and/or depending on external conditions, and can be set around 25° C. with +/−5° C. tolerance. The tolerance may be due to temperature control response time.

Air flow 108 is routed over a number of components on trays 104 in order to provide cooling. Cooling may be performed via impingement of air onto the surfaces of equipment. As air flows upward, e.g., in a direction against gravity, from fan module 106 to fan module 110, the temperature of the air flow increases. Warmed air exits through fan module 110 at the top of rack 102. Fan module 110 may be similar to fan module 106 and may include any number of fans located in a plenum that is local to the rack and is located at the top of the rack. Circulation fans of fan modules 106 and 110 may blow air in the same direction, at the same or different speeds, to create an upward flow 108.

The warmed air exiting rack 102 through top fan module 110 may be cooled locally using a distributed cooling system. The distributed cooling system includes heat exchanger 112 that is local to rack 102. As used herein, a heat exchanger local to a rack is adjacent to, connected to, attached to, and/or corresponding to a rack. For example, the local heat exchanger 112 may be a dedicated cooling system that is independently coupled to, and used by a single rack, rack 102. In some implementations, heat exchanger 112 may be connected to the top of the rack 102 via a substantially sealed interface. The interface may prevent the warm air driven by top fan module 110 from directly escaping back to the workspace. This interface may be achieved by hermetically coupling the top fan module 110 to the heat exchanger 112, incorporating thermal sealant material between the top fan module 110 and the heat exchanger 112, and/or applying any appropriate thermal isolation mechanism for preventing direct heat exchange between the top of rack 102 and the workspace. Instead, air exiting through top fan module 110 is captured in a hot air plenum, which will be referred to as heat exchanger space 114. This heat exchanger space is also local to rack 102 and thermally isolated from the workspace. The thermal isolation of the heat exchanger space 114 and the sealed interface between the top of rack 102 and the heat exchanger 112 may help cool the air exiting rack 102 through top fan module 110 before the air is released back into the workspace. In some implementations, heat exchanger 112 may be connected to data center cooling equipment (not shown) through pipes 111 and 113. Pipes 111 and 113 may provide incoming and outgoing cooling fluid, as described in more detail in FIG. 2 below. Alternatively, heat exchanger 112 may be a standalone unit.

The cooled air is re-circulated back into the workspace as air flow 126. One advantage of the distributed cooling system is that the re-circulated cooled air has a temperature that is substantially equal to a temperature of the ambient air in the workspace. For example, the ambient temperature is the same as workspace temperature with a tolerance of +/−5° C. This temperature can be controlled by changing the fan speed, changing cooling liquid temperature, and/or any other appropriate process, as will be described in further detail below. In this way, the distributed cooling system may prevent local temperature deviation caused by rack system 100 relative to a desired global target temperature of the workspace. This global target temperature may correspond to a temperature that facilitates operation of technicians in the workspace and/or reduces data center cooling or heating needs.

Locally cooled rack system 100 may be open to the workspace from the front side and/or the back side during operation. As described herein, locally cooled refers to cooling by a distributed cooling system that is local to rack system 100. For example, the rack system 100 may be cooled using a heat exchanger 112 that is adjacent to, connected to, and/or coupled to a single rack. This arrangement may have two advantages. First, because the air re-circulated into the workspace has been cooled by heat exchanger 112 before leaving rack system 100 (i.e., as air flow 126), the front/or back of the rack may permit easy access to, and replacement of, tray equipment by technicians at a comfortable or tolerable temperature. Second, air (other than upward flowing air 108) may flow from the workspace over trays 104 through the open front and/or back sides. This may help further cool the equipment, because the ambient air of the workspace may have a lower temperature than the temperature of air flow 108 at the higher trays 104, the air flow 108 having been heated by computer equipment in the lower trays. The vertical arrangement of trays, coupled with the distributed local cooling system, facilitate upward flow of cooling air and increase cooling efficiency. For example, the vertical arrangement of trays may limit the temperature rise of air flow 108 across rack 100, such that the distributed local cooling system is capable of cooling the heated air back to an ambient temperature.

Figure 2:
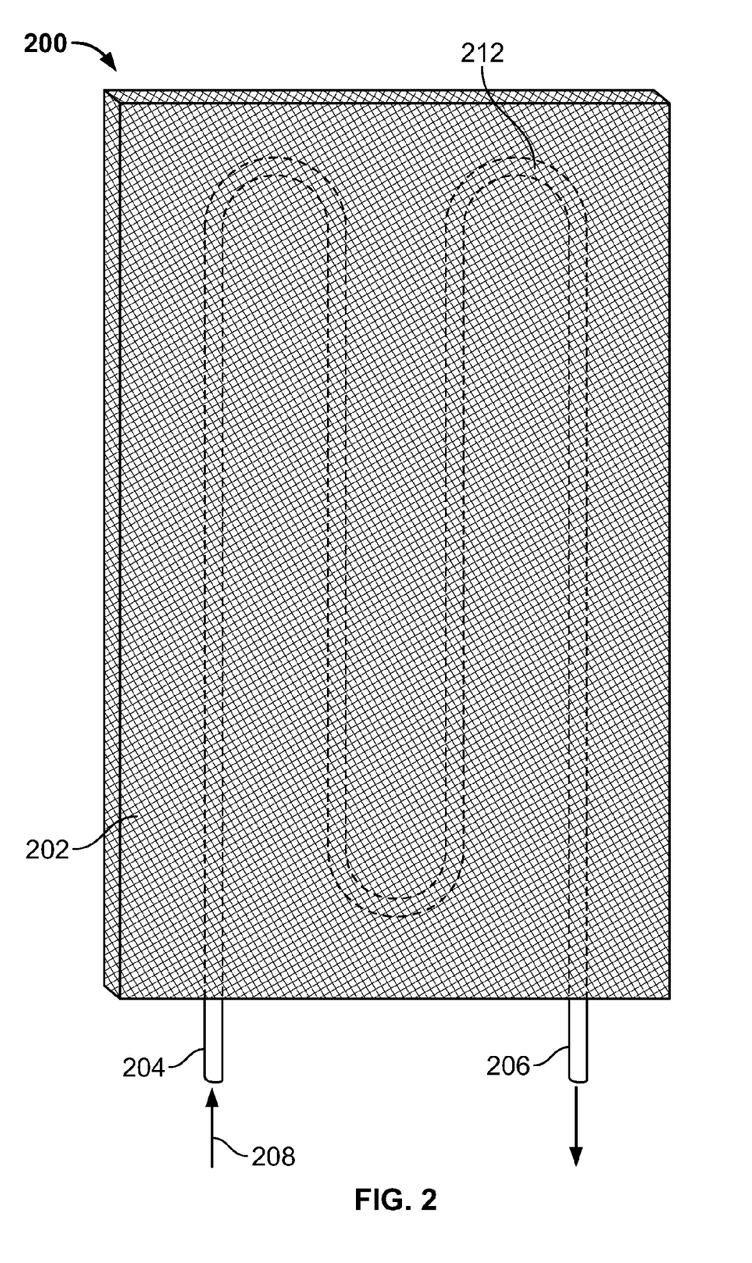
FIG. 2 shows a front view of exemplary cooling equipment according to some implementations.

FIG. 2 shows a front view of exemplary cooling equipment 200 according to some implementations. Cooling equipment 200 may be used as a component of the rack heat exchanger (e.g., heat exchanger 112 of FIG. 1). Exemplary cooling equipment 200 includes cooling pipe 212, which may be embedded in metal net sheet 202.

Cooled fluid 208, such as water, may enter cooling pipe 212 through inlet pipe component 204. The cooled fluid interfaces with air surrounding cooling equipment 200, e.g., air of the heat exchanger space 114. The interfacing is performed via pipe 212 and metal net sheet 202, which increases conductivity of cooling equipment 200. The warm air transfers heat to the cooled fluid, cooling the air and warming the fluid. The warmed fluid finally exits through outlet pipe component 206. The fluid exiting through outlet pipe component 206 may be chilled again, e.g., using a chiller, an evaporative cooling system or some other fluid cooling device, and sent again to cooling pipe 212. It should be understood that cooling equipment 200 is merely exemplary and any suitable cooling device may be used in heat exchanger 112 of FIG. 1 for the purpose of reducing the temperature of the air flowing out of rack system 100 to a substantially ambient temperature.

Figure 3:
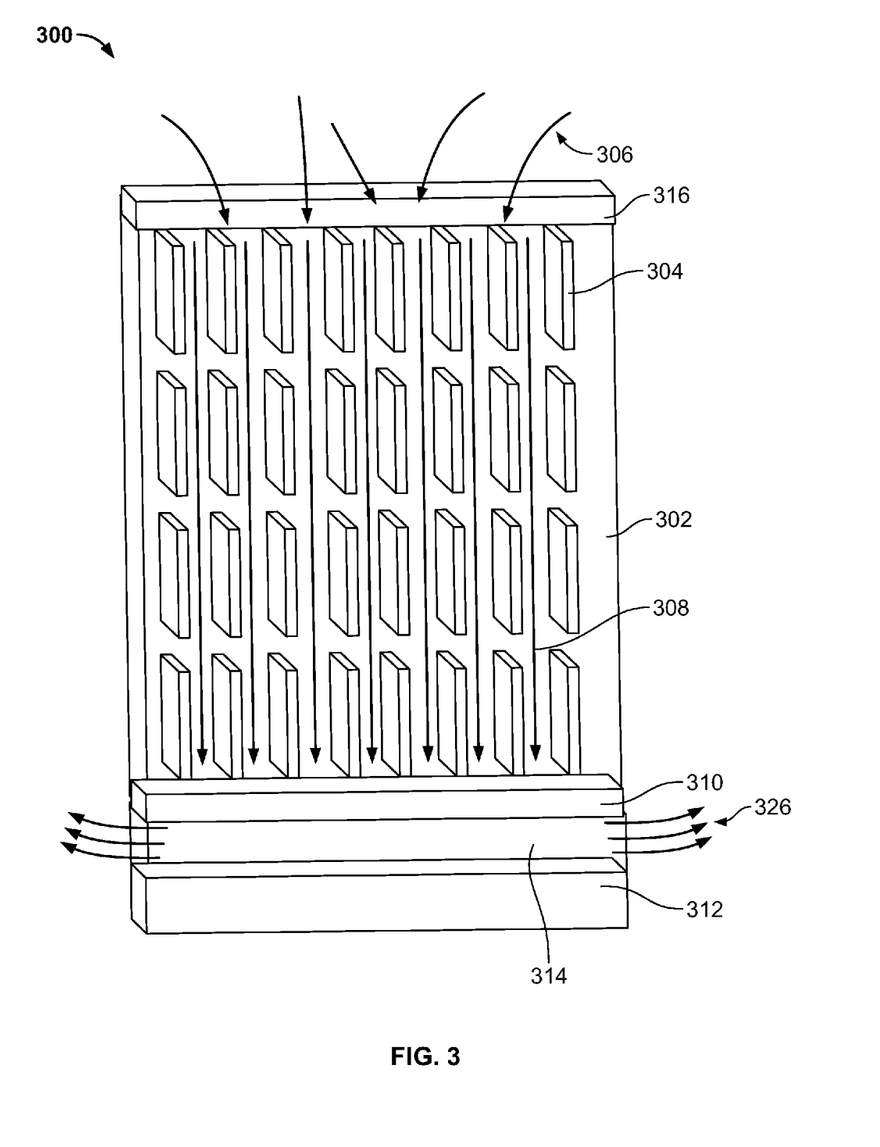
FIG. 3 shows a front view of another exemplary data center rack system according to some implementations.

FIG. 3 shows a front view of another exemplary data center rack system 300 in accordance with an implementation. Data center rack system 300 is similar to rack system 100, except that air flows downward in a direction with gravity through the rack. In particular, ambient air enters from the top of data center rack 300 through top fan module 316, flows downward in a direction with gravity across racks via air flow 308, and is expelled through bottom fan module 310. In addition, the distributed cooling system including heat exchanger 312 and heat exchanger space 314 are located at the bottom of the rack system 300 instead of at the top as in FIG. 1. In some implementations, the distributed cooling system may be placed under elevated ground to reduce wiring and/or space costs or simplify the workspace topology. As ceiling and floor areas of a data center are typically filled with power cables, signal cables, ducts, and/or pipes, the choice of an upward flow configuration (e.g., such as rack system 100 of FIG. 1) or downward flow configuration (e.g., such as rack system 300 of FIG. 3) may allow data center operators to design their system in a way that meets their needs and reduces maintenance costs.

Figure 4:
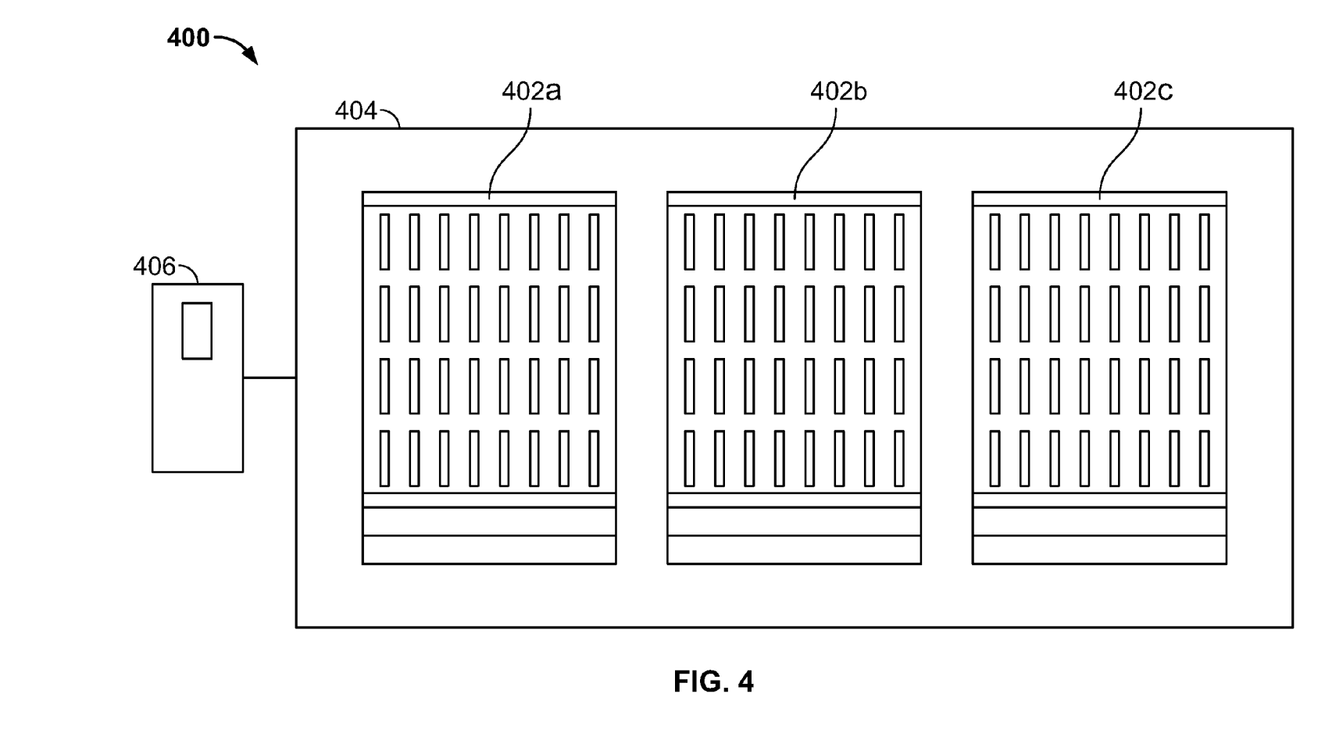
FIG. 4 is a schematic diagram of a cooling system for a data center according to some implementations.

A data center may be made up of a number of racks, each holding multiple trays. FIG. 4 is a schematic diagram of a cooled rack system 400 for a data center, according to some implementations. Cooled rack system 400 includes a plurality of racks, of which three exemplary racks 402a, 402b, and 402c are shown. Rack system 400 optionally includes control terminal 406 for controlling the various racks, e.g., racks 402a, 402b, and 402c.

Although racks shown in FIG. 4 are represented using similar shapes, it should be understood that various types of racks may be used, including systems with a top heat exchanger (e.g., as in FIG. 1), systems with a bottom heat exchanger (as in FIG. 3), as well as any other type. Each rack system may be equipped with its own control processing circuitry. In some implementations, control terminal 406 may be relatively simple, providing only ambient temperature threshold parameters to respective processing circuitries of the racks. In this case, processing circuitry of each rack system may locally regulate operation of the heat exchanger and/or fan modules of the associated rack system. Alternatively, each rack system may receive detailed control commands from control terminal 406. In this case, control terminal 406 may communicate with each rack system for the purpose of regulating the operation of the respective heat exchangers and/or fan modules.

As one advantage of cooling system 400, the operation of a rack may have a reduced effect on the temperature of the workspace in which the rack is located. As a result, racks can be added or removed without a significant impact on the ambient temperature of the data center because each rack performs its own cooling. This simplifies design of the data center and increases reliability. This also increases scalability and provides modular expendability, as racks can be added or removed depending on data center size and computing needs without having to redesign or even modify a central cooling system.

Figure 5:
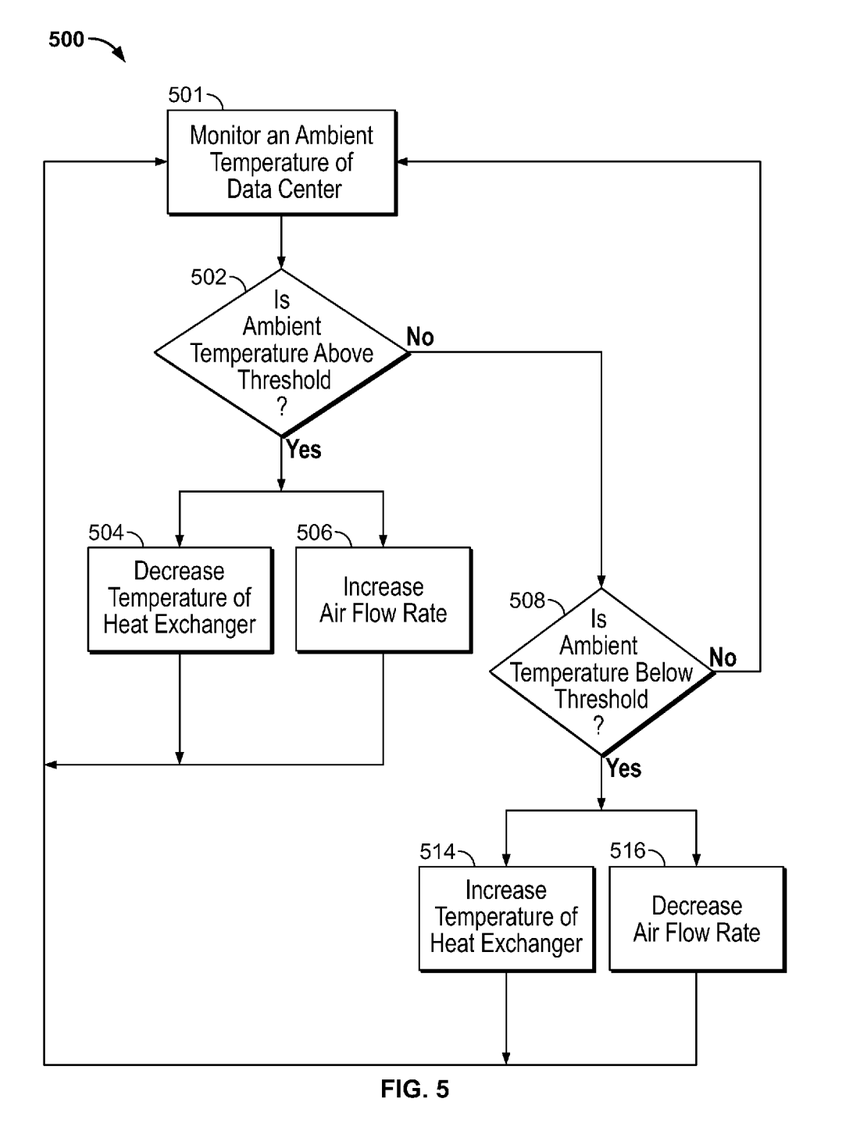
FIG. 5 is a flow chart showing an exemplary method for controlling cooling of a data center rack according to some implementations.

FIG. 5 is a flow chart showing an exemplary process 500 for controlling cooling of a data center rack system according to some implementations. Process 500 may be implemented locally in each rack heat exchanger (e.g., in processing circuitry of heat exchanger 112 of FIG. 1) or centrally (e.g., in processing circuitry of control terminal 406 of FIG. 4).

At 501, an ambient temperature of the data center is monitored. For example, the temperature of the workspace may be periodically measured using a sensor. The monitored temperature may correspond to any appropriate temperature, such as an ambient temperature, computer equipment temperature, rack temperature, and/or tray temperature.

At 502, it is determined whether the monitored ambient temperature exceeds an upper temperature threshold. If the monitored ambient temperature exceeds the upper temperature threshold, then the temperature may be reduced by performing 504 and/or 506 as described below. Otherwise, if the monitored ambient temperature does not exceed the upper temperature threshold, then the temperature may be checked at 508 against a lower temperature threshold. If the ambient temperature is below the lower temperature threshold, then the temperature may be increased by performing 514 and/or 516 as described below. Otherwise, the temperature is within an acceptable operation range (i.e., the temperature is between the lower threshold and the upper threshold) and the process may check the temperature again (at 501) after a certain timeout period The temperature thresholds may be predetermined or dynamically adjusted. For example, the thresholds may be computed based on temperatures determined to create a comfortable or tolerable environment in the workspace of a data center. The thresholds may also be linked to a range of allowable temperature, such as federal or state OSHA-mandated temperatures. Furthermore, the thresholds may be determined to ensure safe operation of the rack-mounted electronic equipment, e.g., subject to a measured or expected temperature rise across a rack. For example, the thresholds may be determined so that rack-mounted equipment operates without significant errors or breakdowns and within a safe operation temperature range.

If the temperature is above the upper temperature threshold, 504 and/or 506 may be performed. At 504, the heat exchanger is adjusted so as to increase cooling. For example, the temperature of the cooling equipment may be decreased so that the air re-circulated into the workspace has a lower temperature.

At 506, the air flow rate is increased across the rack. This may be done by increasing the speed of fans in modules 106 and/or 110 of FIG. 1 (or similarly, fan modules 306 and/or 316 of FIG. 3). In this way, the circulation of air over the trays is increased, helping to prevent creation of localized hot spots on the trays and increasing the cooling effect. Like the heat exchanger adjustment of 504, air flow speed rate adjustment of 506 may decrease the temperature of the air re-circulated into the workspace.

Alternatively, if the temperature is below the lower temperature threshold, 514 and/or 516 may be performed. At 514, the heat exchanger is adjusted so as to decrease cooling. As a result, the air re-circulated into the workspace may have a higher temperature.

At 516, the air flow rate is decreased across the rack. This may be done by decreasing the speed of fans in modules 106 and/or 110 of FIG. 1 (or similarly, fan modules 306 and/or 316 of FIG. 3). In this way, the circulation of air over the trays is decreased, reducing power consumption. Like the heat exchanger adjustment of 514, the air flow speed rate adjustment of 516 may decrease the temperature of the air re-circulated into the workspace.

In response to the feedback accomplished by performing 504, 506, 514, and/or 516, the temperature of the data center is measured again at 501 and the ambient temperature is checked again against the temperature thresholds at 502 and 508. In this way, process 500 may continue to adjust the distributive cooling system of each rack to maintain the ambient temperature of the workspace within an acceptable range. Each rack system 100 may implement a cooling control process 500 as described above. In this manner, each rack system may regulate its cooling based on its own settings, location in the data center, cooling capabilities, computer equipment cooling needs, and so on.

A number of implementations have been described. Nevertheless, it will be understood that various modifications may be made without departing from the spirit and scope of the disclosures in this document. For example, additional components may be added to those shown above, or components may be removed or rearranged. Also particular values for temperatures and other such values may be varied. Moreover, while operations of process 500 are depicted in the drawings in a particular order, this should not be understood as requiring that such operations be performed in the particular order shown or in sequential order, or that all illustrated operations be performed, to achieve desirable results. In certain circumstances, parallel processing may be advantageous. Further, certain portions of the invention may be implemented as "logic" or a "component" that performs one or more functions. This logic may include hardware, such as an application specific integrated circuit or a field programmable gate array, software, or a combination of hardware and software.

What is claimed is:

1. A method of cooling electronic equipment on a rack, the method comprising:
   vertically circulating ambient air from a workspace across a plurality of rack-mounted electronic devices, wherein the electronic devices are located in a plurality of trays, and wherein each tray has a major plane and is arranged so that its major plane is substantially parallel to a side plane of the rack;
   cooling the circulated air with a heat exchanger, wherein the heat exchanger is connected to a vertical end of the rack via a sealed interface, and the cooling comprises capturing air heated by the electronic devices in a hot air plenum that is local to the rack and is thermally isolated from the workspace, and cooling the captured air using cooling equipment; and
   re-circulating the cooled air to the workspace.

2. The method of claim 1, wherein the re-circulated cooled air has a temperature that is substantially equal to a target temperature of the ambient air in the workspace.

3. The method of claim 1, wherein each device has a width dimension, a depth dimension, and a height dimension, wherein the height dimension is longer than the width dimension, and wherein the device is mounted to a corresponding tray having the major plane substantially parallel to the height dimension.

4. The method of claim 1, wherein each tray is arranged so that the major plane is substantially perpendicular to said vertical end plane of the rack and to a front plane of the rack.

5. The method of claim 1, wherein air is captured by one or more ambient air circulation fans located in a plenum that is local to the rack, wherein the plenum is located at the vertical end of the rack.

6. The method of claim 1, wherein the ambient air is circulated by one or more air circulation fans located in a plenum that is local to the rack, wherein the plenum is located at another vertical end of the rack.

7. The method of claim 1, wherein the rack-mounted electronic devices are open to the workspace from at least one of a front side or a back side of the rack during operation.

8. The method of claim 1, further comprising:
   monitoring an ambient temperature of the workspace;
   determining if the monitored ambient temperature exceeds a threshold; and
   in response to determining that the monitored ambient temperature exceeds the threshold, performing at least one of:
      increasing a flow of the circulated air across the plurality of rack-mounted electronic devices, or
      decreasing a cooling temperature in the heat exchanger.

9. A system for cooling electronic equipment on a rack, the system comprising:
   one or more air circulation fans for vertically circulating ambient air from a workspace across a plurality of rack-mounted electronic devices, wherein the electronic devices are located in a plurality of trays and wherein each tray has a major plane and is arranged so that its major plane is substantially parallel to a side plane of the rack;
   a heat exchanger, local to the rack, for cooling the circulated air and re-circulating the cooled air to the workspace, wherein the heat exchanger is connected to a vertical end of the rack via a sealed interface;
   a hot air plenum, local to the rack, for capturing air heated by the electronic devices, wherein the hot air plenum is thermally isolated from the workspace; and
   cooling equipment for cooling the captured air.

10. The cooling system of claim 9, wherein the re-circulated cooled air has a temperature that is substantially equal to a target temperature of the ambient air in the workspace.

11. The cooling system of claim 9, wherein each device has a width dimension, a depth dimension, and a height dimension, wherein the height dimension is longer than the width dimension, and wherein the device is mounted to a corresponding tray having the major plane substantially parallel to the height dimension.

12. The cooling system of claim 9, wherein each tray is arranged so that the major plane is substantially perpendicular to said vertical end plane of the rack and to a front plane of the rack.

13. The cooling system of claim 9, wherein at least one of the one or more air circulation fans are located in a plenum that is local to the rack, wherein the plenum is located at the vertical end of the rack.

14. The cooling system of claim 9, wherein at least one of the one or more air circulation fans are located in a plenum that is local to the rack, wherein the plenum is located at another vertical end of the rack.

15. The cooling system of claim 9, wherein the rack-mounted electronic devices are open to the workspace from at least one of a front side or a back side of the rack during operation.

16. The cooling system of claim 9, further comprising processing circuitry located at least in part on the rack, the processing circuitry configured to:
   monitor an ambient temperature of the workspace;
   determine if the monitored ambient temperature exceeds a threshold; and
   in response to determining that the monitored ambient temperature exceeds the threshold, perform at least one of:
      increasing a flow of the circulated air across the plurality of rack-mounted electronic devices, or
      decreasing a cooling temperature in the heat exchanger.

17. A system of cooling electronic equipment on a rack, the system comprising:
   means for vertically circulating ambient air from a workspace across a plurality of rack-mounted electronic devices, wherein the electronic devices are located in a plurality of trays and wherein each tray has a major plane and is arranged so that its major plane is substantially parallel to a side plane of the rack;
   means for cooling the circulated air, wherein the means for cooling is connected to a vertical end of the rack via a sealed interface, the means for cooling comprising:
      means for capturing air heated by the electronic devices in a hot air plenum local to the rack, wherein the hot air plenum is thermally isolated from the workspace; and
      means for cooling the captured air to the temperature that is substantially equal to the temperature of the ambient air in the workspace; and
   means for re-circulating the cooled air to the workspace.

18. The cooling system of claim 17, wherein the re-circulated cooled air has a temperature that is substantially equal to a target temperature of the ambient air in the workspace.

19. The cooling system of 17, wherein air is circulated vertically downward from a top to a bottom of the rack.

20. A system for cooling electronic equipment on a rack, the system comprising:
   one or more air circulation fans for vertically circulating ambient air from a workspace across a plurality of rack-mounted electronic devices, wherein the electronic devices are located in a plurality of trays and wherein each tray has a major plane and is arranged so that its major plane is substantially parallel to a side plane of the rack; and
   a heat exchanger, local to the rack, for cooling the circulated air and re-circulating the cooled air to the workspace, wherein the heat exchanger is connected to a vertical end of the rack via a sealed interface,
   wherein the rack-mounted electronic devices are open to the workspace from at least one of a front side or a back side of the rack during operation.

* * * * *